United States Patent [19]

Reese et al.

[11] Patent Number: 4,679,007
[45] Date of Patent: Jul. 7, 1987

[54] MATCHING CIRCUIT FOR DELIVERING RADIO FREQUENCY ELECTROMAGNETIC ENERGY TO A VARIABLE IMPEDANCE LOAD

[75] Inventors: George Reese, Wyoming, Mich.; Richard Spielmaker; Douglas Schatz, both of Ft. Collins, Colo.

[73] Assignee: Advanced Energy, Inc., Ft. Collins, Colo.

[21] Appl. No.: 736,215

[22] Filed: May 20, 1985

[51] Int. Cl.$^4$ ............................................. H03H 7/40
[52] U.S. Cl. .................................. 333/17 M; 333/32; 336/229; 361/299
[58] Field of Search ................. 333/17 M, 32; 334/82; 336/200, 229

[56] References Cited

U.S. PATENT DOCUMENTS 3,596,204  7/1971  Vane .
3,624,550 11/1971  Vane .
3,921,092 11/1975  Schatz .
3,935,412  1/1976  McDonough et al. .
3,941,966  3/1976  Schatz .
4,061,800 12/1977  Anderson .
4,158,717  6/1979  Nelson .
4,392,932  7/1983  Harra .
4,499,752  2/1985  Fruzzetti et al. .
4,500,409  2/1985  Boys et al. .

Primary Examiner—Paul Gensler
Attorney, Agent, or Firm—Price, Heneveld, Cooper, DeWitt & Litton

[57] ABSTRACT

A matching circuit is provided for delivering radio frequency electromagnetic energy from a radio frequency power supply to a variable impedance load such as a gas plasma. The matching network couples and impedance matches the power supply to the load. The matching network includes a ratio circuit for establishing a voltage ratio between the power supply and the load and a tuning circuit for tuning out a complex portion of the reactance of the load. Separation and control of the ratio and tuning variables is achieved through provision of a ratio control circuit comprising a lumped quarter wave transformer and a tuning control circuit comprising a variable tuning capacitance and a tuning inductance electrically connected in parallel to the load. The lumped quarter wave transformer comprises first and second ratio inductances electrically connected parallel to the load; a first variable ratio capacitance electrically connected in series with the load; and second and third variable ratio capacitances electrically connected parallel to the load. Ratio and tuning inductances are provided comprising toroidal-shaped forms having layers of electrically conductive material deposited or applied thereover. The ratio and tuning capacitances are provided with electrically floating butterfly-shaped rotors ganged on drive shafts driven by high speed torque motors.

17 Claims, 18 Drawing Figures

MATCHING CIRCUIT FOR DELIVERING RADIO FREQUENCY ELECTROMAGNETIC ENERGY TO A VARIABLE IMPEDANCE LOAD

BACKGROUND OF THE INVENTION

The invention is directed broadly to a matching circuit for delivering radio frequency electromagnetic energy to a plasma. More particularly, the invention is directed to such a matching circuit adapted for use with a power supply in applications such as sputter coating, sputter etching and other plasma or glow discharge processes commonly used in the thin film industry.

Sputtering devices or gas plasma devices driven by radio frequency (RF) electromagnetic energy are known in the prior art. Such devices are frequently used in the thin film industry, for example, to manufacture semiconductors. All such devices suffer from the common problem that a fixed impedance or variable impedance radio frequency generator must be coupled to the variable impedance load of a plasma disposed within a vacuum chamber. In the prior art, impedance matching circuits are provided which are quite similar to antenna matching circuits used in the broadcast industry. Such prior art matching circuits suffer from problems that stem both from the operational theory of the circuit as well as the design of the components used to carry out the impedance matching function.

In prior art impedance matching circuits used in this application, only two variable capacitors are provided and the process of changing the voltage ratio between the generator and power supply changes the tuning so that when one servo loop moves, the other servo loop must move in response thereto to achieve a match. The result is an iterative process or a phase space spiral approach to impedance match rather than a direct approach to impedance match. A spiral rather than a direct approach to impedance match is an inherently slower and imprecise technique. In a gas plasma application it is very important to achieve impedance matching as quickly as possible to achieve a consistent process rate such as consistent deposition of the target material in a sputtering operation. Thus, in the thin film industry there is a need for an impedance matching circuit for a radio frequency generator having better speed, and improved dynamic accuracy to the match.

In general, the prior art has used linear vacuum capacitors with a gear motor, gear rack, or lead screw-type drive and a bang-bang servo drive without variable separation to accomplish tuning. Linear gear driven capacitors are not readily adapted for high speed operation or synchronous movement when multiple capacitors are required. Another problem with prior art linear vacuum capacitors results from the need to make electrical contact through moving components such as bearings, bellows and the like.

Other problems with prior art impedance matching circuits stems from the fact that the power level in the circuit is relatively high, on the order of several kilowatts. In addition to the power level being high, the plasma load is very electrically reactive so that in addition to the high power flow there is a reactive power flow or energy circulation between the tuning elements which is quite large. In some cases, the power circulation between the tuning elements of the matching circuit can be over 10 times the real power flowing into the plasma load. Thus, it is quite desirable to keep losses at a minimum. Prior art inductances used in this application are generally of a solenoidal coil type which has very high end losses. Since power levels are high, a relatively large diameter conductor is often necessary to accommodate power. However, large diameter conductors also have large eddy current losses. When cylindrical-shaped inductors are wound with strap or flat conductor, the end loss problem is exacerbated because the end of the strap looks like a shorted turn. When toroidal-shaped inductors are wound with strap conductor variable and inevitably large insulating gaps on the periphery of the toroid also present substantial losses.

SUMMARY OF THE INVENTION

According to the present invention, these and other problems are solved by provision of a matching circuit, featuring separation of ratio and tuning variable topology, for delivering radio frequency electromagnetic energy from a power supply to a variable impedance plasma. A matching network is provided for coupling and impedance matching the power supply to the load, the matching network comprising a ratio control circuit for establishing a voltage ratio between the power supply and the load and a separate tuning control circuit for simultaneously tuning out any complex portion of the reactance of the load. Separation of ratio and tuning variables in this fashion results in a direct approach to the impedance match. Separation of variable topology thus provides better speed and better accuracy of match, factors which are both very important in a gas plasma application.

The ratio control circuit preferably comprises a lumped quarter wave transformer. The lumped quarter wave transformer comprises first and second ratio inductances electrically connected in parallel to the load; a first variable ratio capacitance electrically connected in series with the load; a second variable ratio capacitance electrically connected parallel to the load and a third variable ratio capacitance electrically connected parallel to the load. The tuning circuit preferably comprises a tuning inductance electrically connected parallel to the load and a variable tuning capacitance electrically connected parallel to the load. The ratio and tuning capacitances comprise a plurality of electrically floating butterfly-shaped rotors interleaved with a plurality of stator elements. The ratio capacitances are ganged on a common ratio drive shaft along with a butterfly-shaped feedback capacitor used for control purposes. The ratio drive shaft is angularly driven by a high speed ratio torque motor. Similarly, the tuning capacitor and a butterfly-shaped tuning feedback capacitor are ganged on a common tuning drive shaft driven by a high speed tuning torque motor. This design insures the fast, synchronous and accurate operation of the multiple variable capacitances.

The ratio tuning inductances are provided with a low loss design which comprises a toroidal-shaped electrically insulating form having a strap-like layer of electrically conductive copper deposited or applied thereon. Problems encountered in the prior art with regard to the end losses resulting from spiral wrapping strap-shaped conductors on cylindrical or toroidal forms is avoided by several techniques. One such technique involves forming the conductors with a spirally wrapped length of narrow plating tape disposed around the toroidal-shaped form. Thereafter, the copper conductor is plated onto the form and the plating tape is removed to create a strap conductor having a substantially uniform insulating gap spiralling around the periphery of the toroid-shaped form.

A radio frequency sensing circuit is provided for determining the impedance of the plasma load and inputting it to a network controller. The impedance of the radio frequency power supply is compared to the sensed impedance of the gas plasma load and command signals are generated which are inputted to a ratio servo amplifier and a tuning servo amplifier. The ratio servo amplifier compares the output of the ratio feedback capacitor to the ratio command signal and drives the ratio servo motor to directly control the voltage ratio between the plasma load and the radio frequency power supply. Similarly, the tuning servo amplifier compares the output of the tuning feedback capacitor to the servo command signal and drives the tuning servo motor to directly and simultaneously tune out any complex portion of the reactance of the load.

According to another aspect of the invention the output of the radio frequency sensing circuit, the ratio feedback capacitor and the tuning feedback capacitor are inputted to a process controller. The information implicit from the input conditions and the actual complex load impedance are used to determine the physical parameters of the discharge process. Once determined, such parameters can be used for active process control or can be displayed and/or recorded for reference.

DESCRIPTION OF THE PREFERRED EMBODIMENTS

Figure 1:
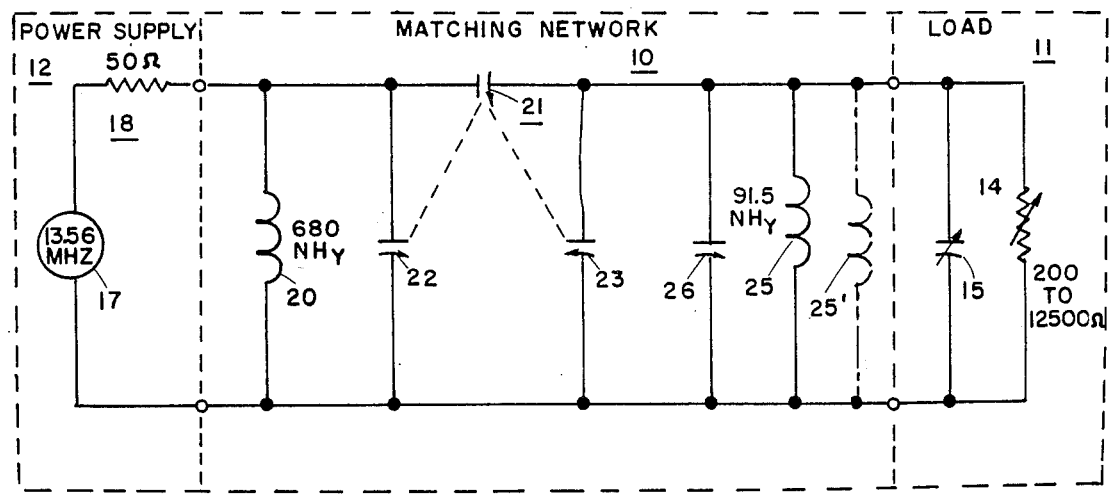
FIG. 1 is a schematic of a matching network constructed according to the present invention connected to a power supply and a load.

With reference now to FIG. 1, a matching network is illustrated at 10 for delivering radio frequency electromagnetic energy to a plasma. In this case, the matching network 10 is used to couple and impedance match a variable impedance plasma load 11 with a fixed impedance radio frequency generator or power supply at 12. However, the matching network may be used with power supplies having a variable impedance. The load 11 comprises a variable resistance 14 which varies from a range of about 200 ohms to about 12,500 ohms, connected in parallel with a variable capacitance 15. This parallel circuit represents the equivalent circuit of a plasma load of the type encountered in sputter coating or etching applications, and gas plasma, or glow discharge applications, or the like, hereinafter simply referred to as discharge processes. However, there may be other applications for the invention. The power supply 12 comprises a fixed frequency 13.56 mHz radio frequency generator 17 having a fixed series resistance 18 of approximately 50 ohms. The matching network 10 comprises a ratio control means or circuit for directly establishing a voltage ratio between the power supply and the load as well as a tuning control means or circuit for directly tuning out the complex portion of the reactance of the load. Preferably, the ratio control means comprises a lumped quarter wave transformer including a first ratio inductance 20 electrically connected parallel to the load; a first variable ratio capacitance 21 electrically connected in series with the load; a second variable ratio capacitance 22 electrically connected parallel to the load; a third variable ratio capacitance 23 electrically connected parallel to the load and a second ratio inductance 25 electrically connected parallel to the load.

Figure 2:
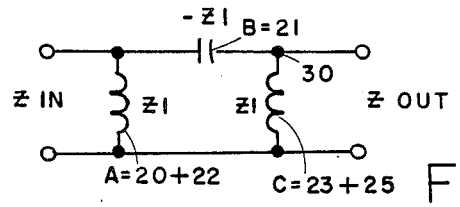
FIG. 2 is a schematic of an equivalent circuit of the ratio controlling circuit of the present invention.

The operation of the lumped quarter wave transformer which comprises the ratio control circuit is best understood by making additional reference to the equivalent circuit illustrated in FIG. 2. In FIG. 2, shunt inductor input A is the equivalent of first ratio inductance 20 and second variable ratio capacitance 22. Series capacitance element B is equivalent to first variable ratio capacitance 21. Shunt inductor output C is equivalent to third variable ratio capacitance 23 and second ratio inductance 25. If it is assumed that the three components A, B and C are provided with impedances of Z1, −Z1, and Z1 then it can be demonstrated that match is achieved between Zin and Zout when Z1 equals the square root of the product of Zin and Zout. In this discussion, it is assumed that the capacitors are provided with the capability of synchronously tracking the desired impedances. Assuming that Zin corresponds to the fixed frequency of the power supply 12, it should be appreciated that Zout is a direct function of Z1. This can be better appreciated by viewing the capacitor B and the inductor C as a series tuned circuit with high Q and small loss driven at its resonant frequency. Such a circuit will, of course, develop a very high voltage at its common point 30 due to the large circulating current between the series tuned components B and C. Larger values of Z1 produce a greater voltage at common point 30 while smaller values of Z1 provide a smaller voltage at common point 30.

With reference now again specifically to FIG. 1, in addition to the ratio control circuit, a tuning control circuit is provided which comprises a tuning inductance illustrated at 25' (in phantom) in parallel with the load, and a variable tuning capacitor 26 in parallel with the load. The shunt inductor 25' is provided with sufficient inductance to more than cancel out the capacitance 15 of the load 11. Thus, the tuning capacitor 26 is used to provide the equivalent of a variable inductor to tune out the effect of components 15 and 25' completely cancelling the complex or imaginary part of the impedance of the load 11, leaving only a real component or simple load resistance as the equivalent load. The tuning inductor 25' is illustrated in phantom since, in preferred embodiments of the invention, it is simpler to lump this component with the second ratio inductor 25 so that only a single larger inductance is required. Thus, in the preferred embodiment of the invention, the single inductor 25 functions as a shunt inductor in both the ratio control circuit and the tuning control circuit. It should be readily appreciated that given an arrangement for synchronously adjusting variable ratio capacitors 21, 22 and 23 and adjusting tuning capacitor 26, such a circuit converges directly on the impedance match, providing a faster match and a more accurate match. As previously discussed, speed and accuracy of match are necessary in discharge processes to provide a consistent result.

Figure 4:
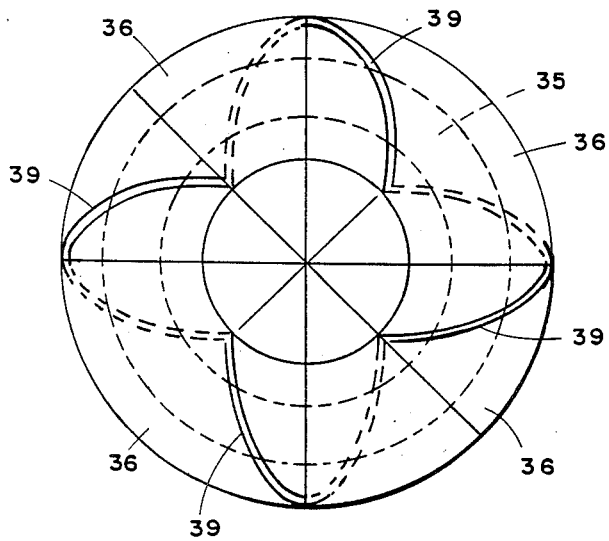
FIG. 4 is a plan view of a toroidal-shaped inductance constructed according to the present invention.
Figure 3:
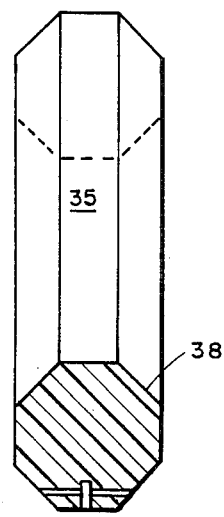
FIG. 3 is a side view partially in section, of a form used to construct a toroidal-shaped inductance according to the present invention.

With reference now to FIGS. 3 and 4, it is illustrated that according to the present invention, the ratio and tuning inductances are preferably formed from a toroidal-shaped, electrically insulating form 35 having a layer of electrically conductive material 36 deposited or applied thereon. While the toroid-shaped form 35 would be preferably formed having a circular cross section, as best illustrated in FIG. 3, the form 35 has been provided with a octagonal cross section illustrated at 38. The eight-sided cross section 38 is presently used because the form 35 is conveniently machined from a suitable insulating plastic material, such as Teflon. With particular reference to FIG. 4, it is illustrated that the coils 36, which encircle the periphery of the toroid-shaped form 35, are formed by spirally wrapping a length of narrow plating tape about the form 35 in the area corresponding to the insulating gaps 39 extending between the coils 36. The wrapped form 35 is then plated with copper and the plating tape removed to leave the narrow insulating gaps 39 between the coils 36. This technique provides coils 36 formed from large flat conductors having low eddy current losses and permits the formation of a toroid-shaped coil with strap-like conductors having uniform end gaps which result in very low end gap losses. This constructions is, of course, important in the present application because of the high power loads transmitted through the circuit as well as the high circulating loads within the circuit. While it is presently contemplated that the coils will be formed by plating them on an insulating form as just described, in other embodiments of the invention the coils may be freestanding, they may be formed with an etching process or they may be sputtered, painted, plated or otherwise suitably deposited on a form.

Figure 6:
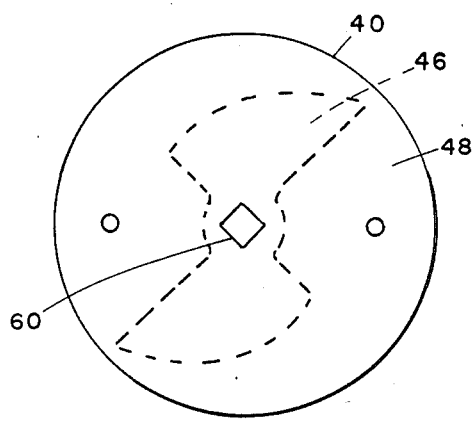
FIG. 6 is a plan view of the rotor of a ratio capacitor constructed according to the present invention.
Figure 7:
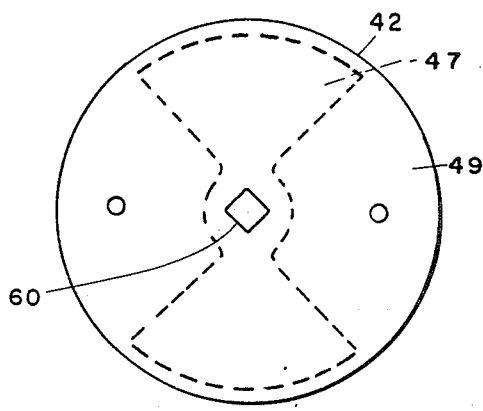
FIG. 7 is a plan view of a rotor of a tuning capacitor constructed according to the present invention.
Figure 8:
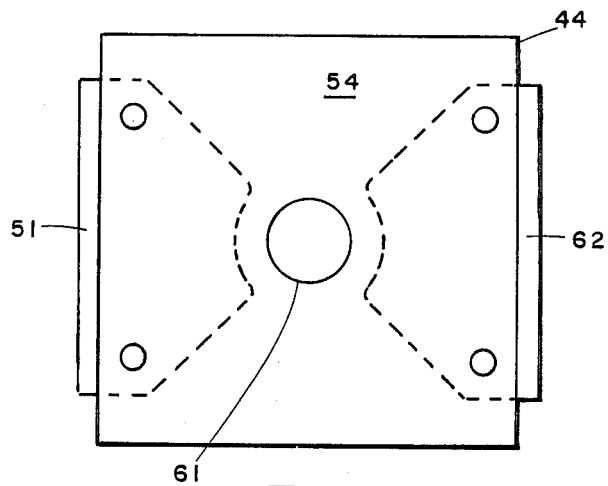
FIG. 8 is a plan view of a stator element for a ratio or tuning capacitor constructed according to the present invention.
Figure 5:
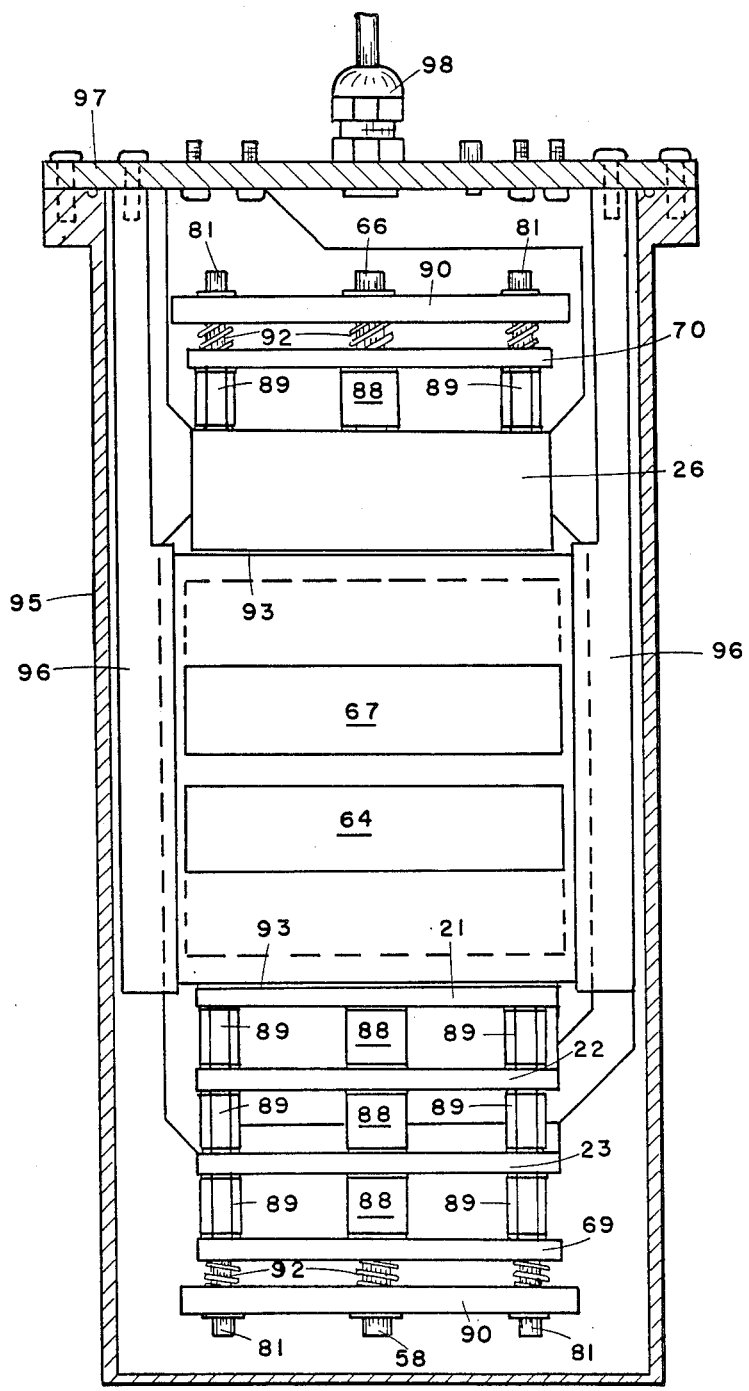
FIG. 5 is an elevational view partially in section, of a variable capacitance constructed according to the present invention.

With reference now to FIG. 5, the variable ratio and tuning capacitances constructed according to the present invention are illustrated in further detail. The first, second and third ratio capacitances each comprise butterfly-shaped ratio capacitor rotors and cooperating ratio stators disposed at 21, 22 and 23. Similarly, the tuning capacitor comprises a butterfly-shaped tuning capacitor rotor and a cooperating tuning stator disposed at 26. With reference now also to FIG. 6, a representative butterfly-shaped ratio rotor element is illustrated at 40. With reference to FIG. 7, a representative butterfly-shaped tuning rotor element is illustrated at 42. With reference to FIG. 8, a representative ratio or tuning stator is illustrated at 44. The rotors 40 and 42 both comprise butterfly-shaped conductive copper elements 46 and 47 laminated within a lubricious plastic disc 48 and 49, respectively. The shape of the copper elements 46 and 47 is determined by the desired response curves of the machine circuit. Similarly, the representative stator section 44 comprises copper stator sections 51 and 52 laminated within a lubricious sheet 54. The material within which the copper elements are laminated is preferably any easily laminated material having a low dielectric loss within the operating frequency of the capacitor. In this case, polyethylene is used. The rotors and stators can be manufactured with a variety of adhesive bonding or printed circuit board construction techniques.

With reference now again to FIG. 5, it is illustrated that each of the rotors of the ratio capacitors 21, 22 and 23 are mounted to or ganged on a common drive shaft 58. The drive shaft 58 is provided with a rectangular cross section which engages the central rectangular apertures 60 disposed in each of the rotors 40 and 42, illustrated in FIGS. 6 and 7, respectively. The large circular central aperture 61 of representative stator 44, illustrated in FIG. 8, of course, permits the rotation of drive shaft 58 without interference from the stator elements. The drive shaft 58 is engaged and angularly displaced by a high speed ratio torque motor disposed at 64.

Figure 9:
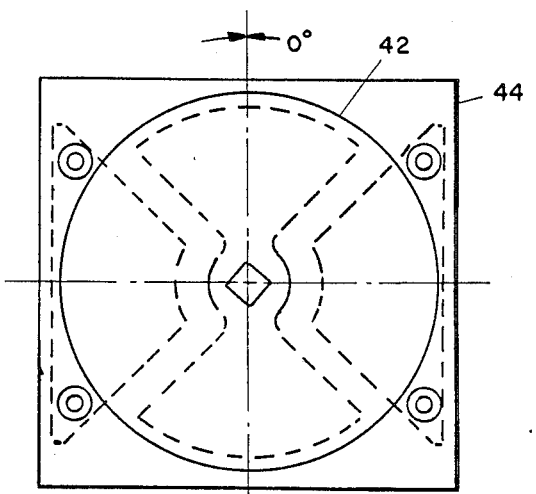
FIG. 9 is a plan view of a tuning rotor overlying a stator in a 0 degree orientation that results in minimum capacitance.
Figure 10:
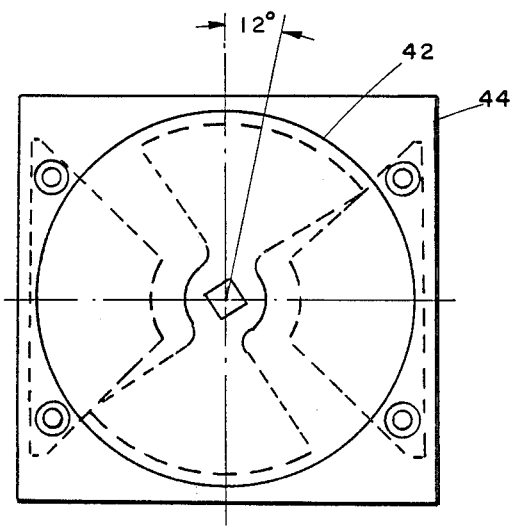
FIG. 10 is a plan view of a tuning rotor overlying a stator in 12 degree orientation.
Figure 11:
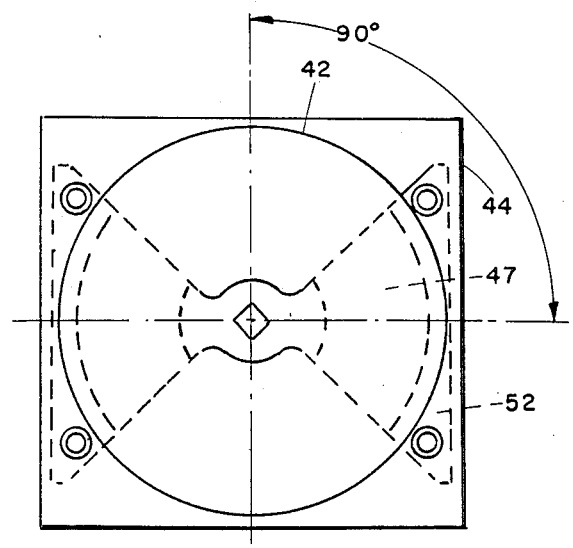
FIG. 11 is a plan view of a tuning rotor overlying a stator in a 90 degree orientation that results in maximum capacitance.

Since the first ratio capacitor 21 must increase proportionally while the second and third ratio capacitors 22 and 23 proportionally decrease and vice versa, brief reference is made to FIGS. 9, 10 and 11 which illustrate a tuning rotor overlaid on a representative stator 44 with the rotor 42 disposed at different angular orientations relative to the stator 44. FIG. 9 illustrates the rotor 42 at a 0 degree orientation relative to the stator 44. The 0 degree orientation of the rotor and stator provide a minimum capacitance value. Rotation of the rotor 42 in either direction relative to the stator 44 will cause an increase in capacitance value. In FIG. 10, the rotor 42 is rotated 12 degrees relative to the stator 44 such that the capacitance value of the device is increased. In FIG. 11, the rotor 42 is rotated 90 degrees relative to the stator 44. In this orientation there is a maximum overlap between the butterfly-shaped copper portion 47 of the rotor 42 and the copper sections or leaves 52 of the stator 44 and this orientation provides a maximum capacitance value. Thus, to achieve an inverse capacitance value with first ratio capacitor 21 with respect to second ratio capacitors 22 and 23 the rotor of first ratio capacitor 21 is permanently mounted to drive shaft 58 at a 90 degree angle relative to the rotors of second and third ratio capacitors 22 and 23 which are mounted in identical angular orientations.

With reference now again to FIG. 5, it is illustrated that the tuning capacitor 26 includes a tuning rotor mounted on tuning drive shaft 66. Again, the shaft 66 is provided with a rectangular cross section for engaging a rectangular aperture 60 on tuning rotor 42, best illustrated in FIG. 7. The tuning drive shaft 66 is engaged and driven by a high speed tuning torque motor 67.

Preferably, a butterfly-type ratio feedback capacitor is disposed at 69 while a butterfly-type tuning feedback capacitor is disposed at 70. The ratio and tuning feedback capacitors are provided with rotors and stators substantially identical to the corresponding ratio and tuning capacitors just described. The ratio and tuning feedback capacitors are preferably ganged or disposed on the ratio and tuning drive shafts 58 and 66, respectively so that the values of these capacitances can be used to provide a measure of the angular displacement of each shaft and the values of the ratio and tuning capacitors. Each of the ratio tuning and feedback capacitors is provided with a construction that features the application of power to the corresponding stator elements of the capacitances, namely, the copper sheets 51 and 52 illustrated in FIG. 8, while the corresponding rotor elements are permitted to electrically float. This has several advantages, the most important of which is the fact that electrical connections involving substantial amounts of power to the rotors of each of the capacitances is eliminated.

Figure 13:
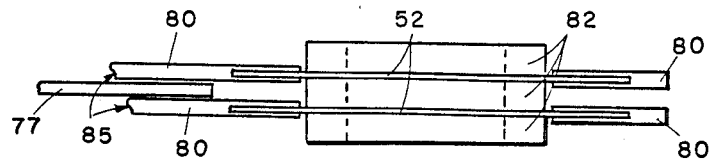
FIG. 13 is a detailed view of one portion of the stator and rotor sections.
Figure 12:
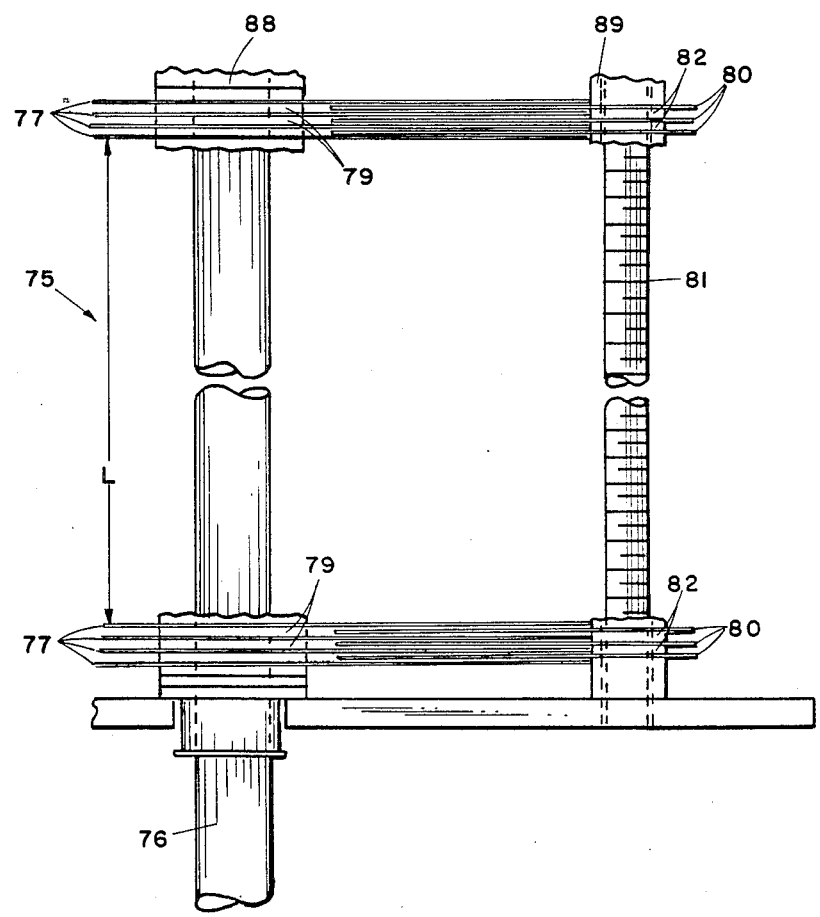
FIG. 12 is a detail view of a single ratio, tuning or feedback capacitance constructed according to the present invention.

With reference now to FIGS. 12 and 13, the construction of a representative capacitance element is generally illustrated at 75. The representative capacitance element 75 includes a central rectangular drive shaft 76 upon which a plurality of rotor elements 77 are mounted in a vertical stack. Although not illustrated herein, it should be understood that the stack of rotor elements 77 extends the length L of shaft 76. A plurality of electrically insulating washers 79 are interleaved between the rotor sections 77 to provide a predetermined spacing between adjacent rotor sections. Similarly, each capacitance element includes a vertical stack of stator elements 80 which are clamped together and in electrical contact with clamping bolt 81. Although not illustrated herein, similarly, the vertical stack of stator elements 80 extends the length L of bolt 81. The spacing between stator elements 80 is determined by a plurality of conductive copper washers 82 which are disposed therebetween. As best illustrated in FIG. 13, the copper washers 82 directly engage the copper stator leaves 52, placing the bolt 81 in electrical contact with the metal portion of the stators. Also, as best illustrated in FIG. 13, the spacing provided by the nonmetallic rotor washers 79 and the copper stator washers 82 provide a plurality of small gaps 85 between the rotor 77 and adjacent stator elements 80.

With reference now again to FIG. 5, each of the ratio tuning and feedback capacitance elements comprises an interleaved stack of rotor and stator elements, as illustrated in FIGS. 12 and 13, separated by rotor spacers 88 and stator spacers 89. Each of the ratio and tuning capacitor assemblies is compressibly loaded by an end plate 90 secured to stator clamp bolts 81 and having springs 92 compressively loaded between the bar 90, the stack of capacitance elements and a nonconductive base plate at 93. The entire assembly is sealed within a nonconductive housing 95 which may be filled with an insulating oil.

The capacitance elements are supported within the housing 95 by a support structure 96 which is fastened to the cap 97 of the housing. The cap 97 also includes an electrical penetration 98 through which electrical connection is made to the stator, the ratio torque motor and the tuning torque motor. The wire extending through this electrical penetration and the electrical connections are not illustrated. However, it should be noted that in the case of each ratio, tuning and feedback capacitor, the stator elements are soldered together or otherwise suitably placed in electrical contact. More particularly, with reference to FIG. 13, the copper leaves 52 and washers 82 can be soldered together so that only one electrical connection is required for each stack of copper stator leaves (51 and 52).

Figure 14:
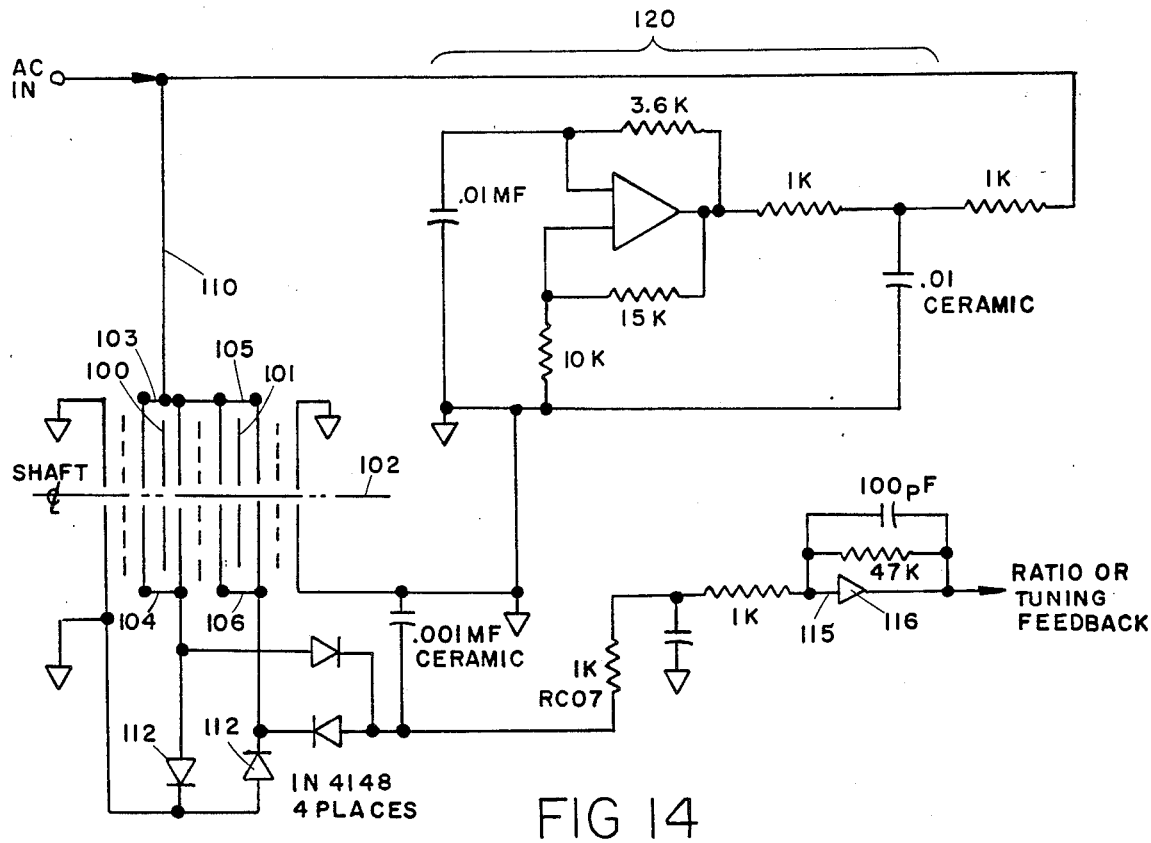
FIG. 14 is a schematic illustration of a feedback capacitor constructed according to the present invention.

With reference now to FIG. 14, the electrical connection to the ratio or tuning feedback capacitors 69 and 70 is illustrated in further detail. As previously noted, each of the ratio and tuning feedback capacitors is provided with rotor and stator sections which physically correspond to the respective ratio or tuning feedback rotors and stators. This insures that the feedback capacitors have the same electrical characteristics as the ratio or tuning capacitors. Thus, if the feedback capacitors are provided with a known relationship to the ratio and tuning drive shafts and the ratio and tuning capacitors, their electrical output will provide a signal which is representative of the position of the drive shaft and the capacitance values of the ratio and tuning capacitors. In FIG. 14, the electrical connection to just one of the ratio or tuning feedback capacitors is illustrated. However, the electrical connection to both feedback capacitors is identical. With specific reference now to FIG. 14, preferably each of the feedback capacitors comprises first and second rotor sections 100 and 101. The centerline of the drive shaft upon which these capacitors are mounted is illustrated at 102. The rotor section 100 is provided with corresponding stator sections 103 and 104 while the rotor section 101 is provided with corresponding stator sections 105 and 106. The rotor sections 100 and 101 are provided with identical cross sections except that the rotor sections are mounted to the shaft at 102 in a 90 degree relationship like that illustrated in FIGS. 9 and 11. Rotor sections provided with such a predetermined angular orientation results in the capacitance of one rotor section being at a minimum when the capacitance of the second rotor section is at a maximum.

A fixed frequency, fixed voltage excitation signal is provided on line 110. The source of the fixed frequency, fixed voltage AC excitation signal is a conventional fast feedback/slow feedback oscillator circuit 120. This excitation voltage is applied to both stator sections 103 and 105 of rotor sections 100 and 101. The current flowing through a capacitor is proportional to the frequency and voltage of the input current as well as the value of the capacitance. Since a fixed frequency and fixed voltage excitation signal is provided, the current flowing through rotor sections 100 and 101 is a function of the capacitance of these rotor sections. Rectifying diodes 112 are provided for rectifying the alternating current flowing through rotor section 100 to a positive direct current (DC). Similarly, the alternating current flowing through rotor section 101 is rectified so as to provide a negative DC current. These currents are inputted to the summing junction 115 of an operational amplifier 116 which provides a feedback voltage output which is proportional to the shaft position of the ratio or tuning capacitors. It is to be understood that both the ratio and tuning feedback capacitors are driven with similar circuits and two circuits such as that illustrated in FIG. 14 will normally be provided, one each for the ratio and tuning feedback capacitors.

Figure 15:
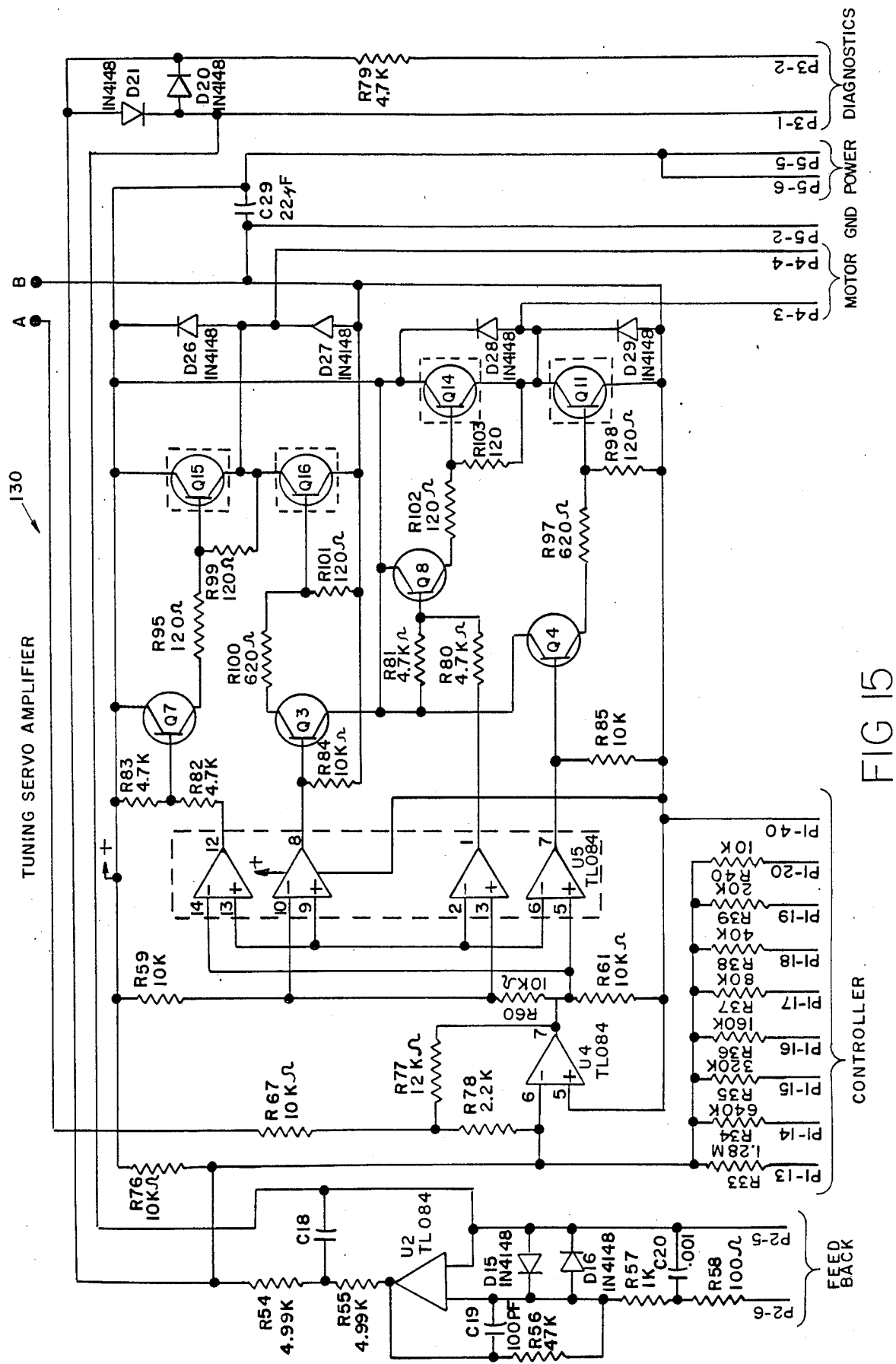
FIG. 15 is a schematic illustration of a tuning servo amplifier constructed according to the present invention.
Figure 16:
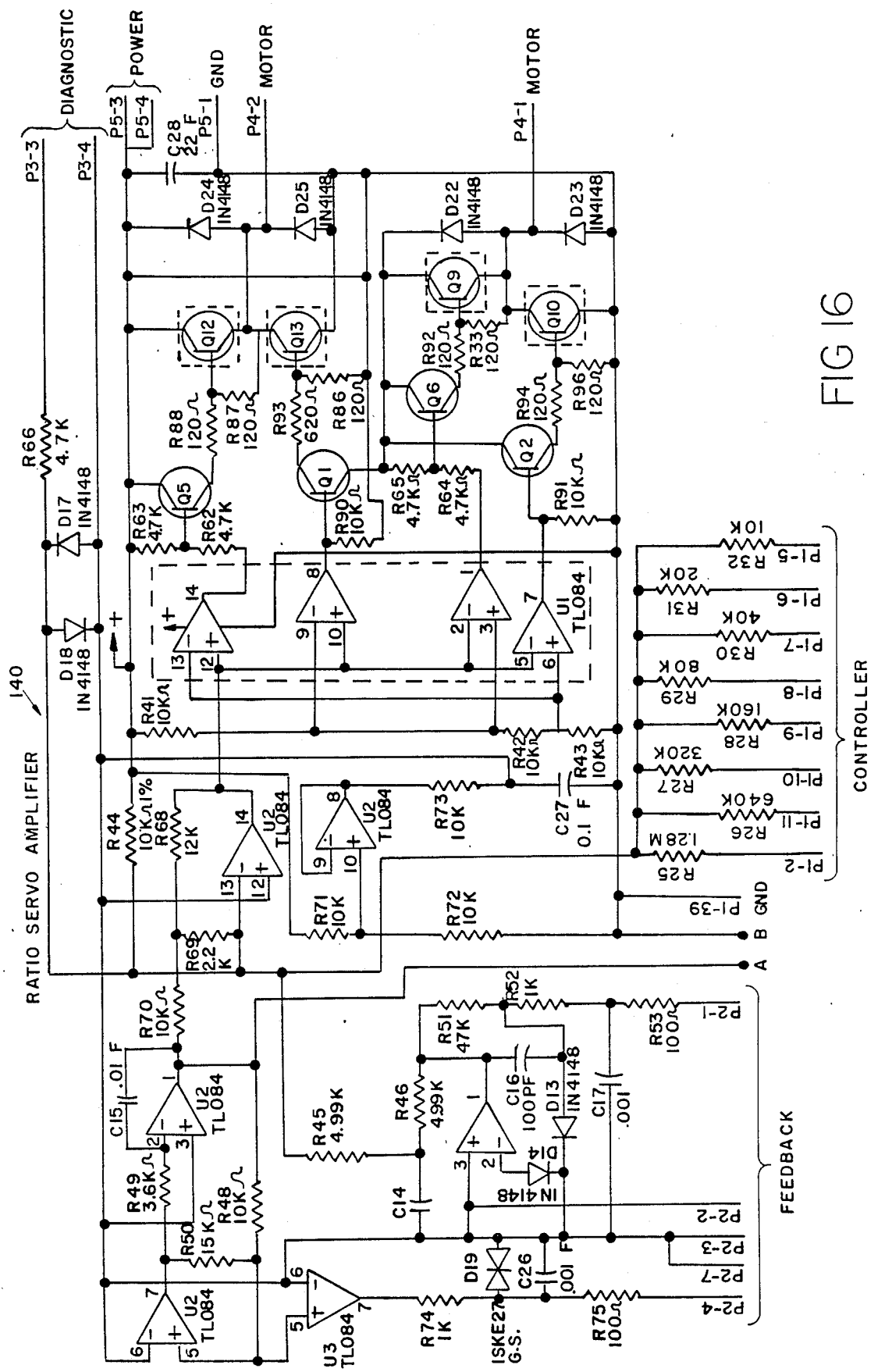
FIG. 16 is a schematic illustration of a ratio servo amplifier constructed according to the present invention.

With reference now to FIGS. 15 and 16, the servo amplifiers for the tuning and ratio circuits are illustrated at 130 and 140, respectively. The servo amplifier circuits are substantially identical for both the ratio and tuning sections. With reference now to FIG. 15 and the tuning servo amplifier circuit illustrated therein at 130, the tuning feedback signal is inputted at pin P2-6. An operational amplifier U2 transforms the feedback signal to a voltage on pin 1 of U2. Amplifier U2 corresponds to the amplifier 116 on FIG. 14. Thus, the voltage on pin 1 of U2 is a voltage representation of the angular position of the drive shaft of the tuning capacitor. That voltage is applied to a buffer and summing amplifier through resistors R55, R54 and R67. Pins P1-20 through P1-13 are logic levels or command signals coming from a controller. The controller provides command signals which are representative of the desired tuning capacitance for match. Resistors R40 through R33, in conjunction with R76 constitute a digital to analog (D to A) convertor. The analog current produced by the D to A convertor is summed with the analogous shaft voltage on pin 6 of operational amplifier U4. This operational amplifier acts as a buffer and its output voltage now reflects the difference between the analogous shaft voltage and the command signal. A triangle voltage is also provided from a triangle generator at amplifier U2, pin 1 so that command feedback and triangle signals are all linearly summed through operational amplifier U4. Operational amplifier U4 then applies these voltages to four comparators which comprise U5. The remaining transistors are in conventional configurations which provide a switching amplifier. There is no overlap between the up-pulling and the down-pulling of the transistors and the time between one transistor turning off and the succeeding transistor turning on is determined by resistances R59, R60 and R61. Four comparators are used to accomplish this switching operation to avoid overlap in the power sources. Thus, the power applied to the motor through pins P4-4 and P4-3 is a variable pulse square wave and the net DC of the square wave is proportional to the difference between the commanded position and the actual position of the tuning capacitance. That net DC flowing to the motor provides a torque and the torque angularly displaces the tuning drive shaft which turns the rotor plates of the tuning capacitor, thus varying the value of both the tuning capacitance and the tuning feedback capacitance to bring the servo loop back to a null position or balanced position.

To keep the efficiency high in this circuit, the output transistors run in switching mode rather than in linear mode. The output peak to peak voltage does not change, only the net DC changes. When viewed as a bipolar power supply, the circuit is a 50 kHz switcher using the motor itself as an inductance. Efficiency is increased by summing the triangle with the error voltage then following that with the comparators to preserve the DC component while adding an AC component which keeps the output transistors nonlinear and therefore efficient. Loop gain is thus determined by the magnitude of the triangle voltage as compared to the error voltage and the gain through R67 is actually the gain determining path.

The ratio servo amplifier illustrated at 140 in FIG. 16 is substantially identical. The output of the ratio feedback capacitor is provided on pin P2-1 and the motor outputs are provided on pins P4-2 and P4-1.

Figure 17:
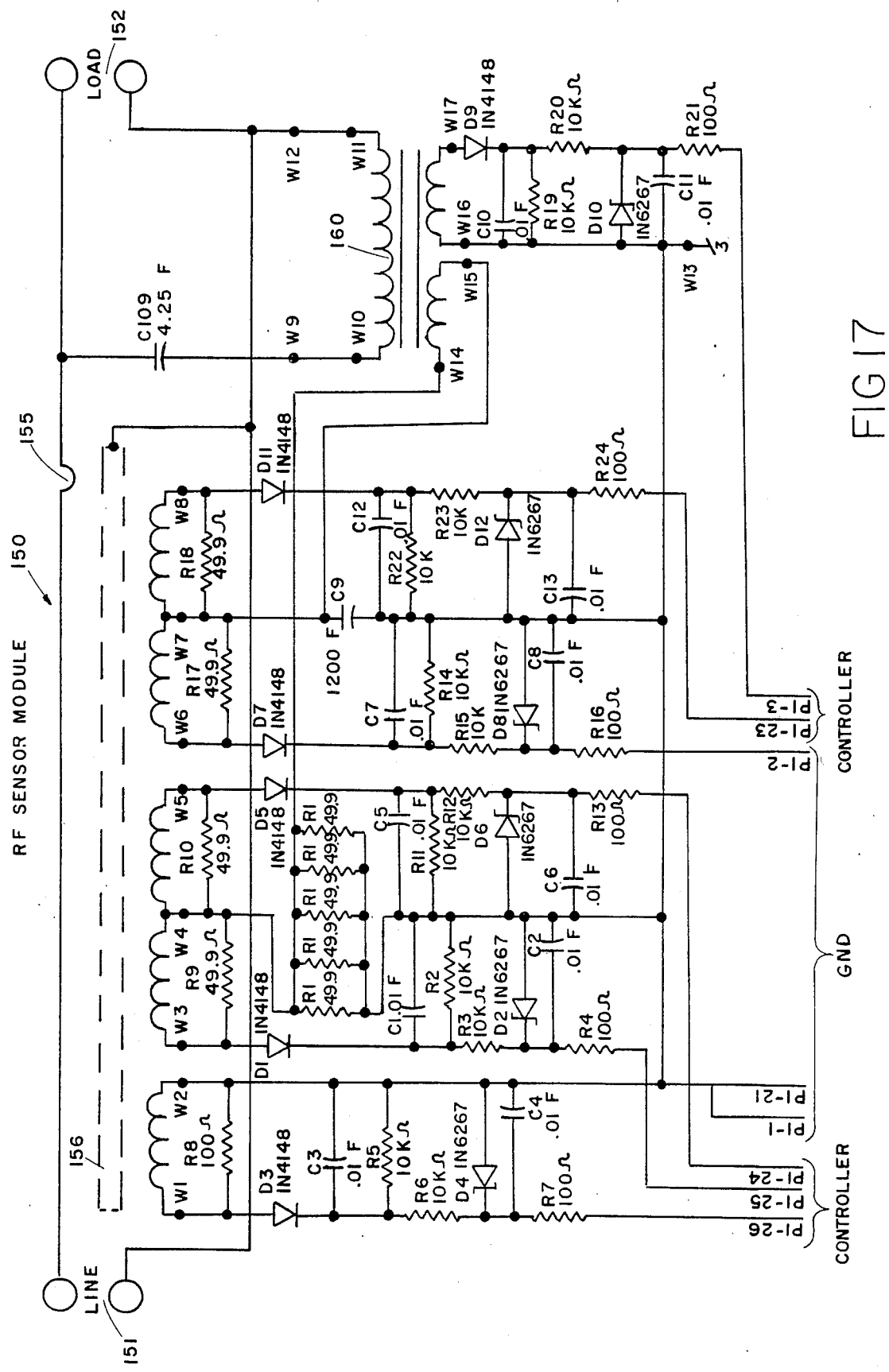
FIG. 17 is a schematic representation of an RF sensor module and a ratio servo amplifier constructed according to the present invention.

With reference now specifically to FIG. 17, the RF sensor module is schematically illustrated at 150. The 13.56 megahertz power supply is inputted on terminals 151. Connection to the matching network 10, and the plasma load 11 is made through terminals 152. At 155, a single loop is illustrated which is the primary of a transformer having multiple secondaries W1 through W8. This is a current sensing transformer with a Faraday shield. The dotted lines 156 and the ground 4 represent a Faraday shield which keeps the electrostatic fields which are present on the conductor to keep these fields from coupling directly to the windings and instead allowing only the magnetic field due to current flow to couple to the windings. The current transformer includes windings W1, W2 connected to load resistances R5 through R8 and rectifying diodes D3 and D4 provide a voltage proportional to the line current. A voltage sensing transformer 160 includes windings W16, W17 and a similar rectifying circuit for providing a DC voltage proportional to the line voltage magnitude. The ratio of these signals provides a measure of impedance. The voltage transformer 160 includes an additional secondary W14 and W15 loaded by capacitors C9 and resistances R1. Since the same current flows in both the capacitance and resistance, the voltages are 90 degrees out of phase, that is to say, the voltage on C9 lags 90 degrees behind the voltage R1. That 90 degree lag to voltage is added to the voltage proportional to the current in windings W6 and W9 of current transformer 155. The net after that vector addition is rectified to provide DC voltages representing the vector sum of the voltage and the current. Similarly, the voltage across R1 is vectorially summed with the voltage present on windings W3 and W6. That vector sum is rectified to provide a DC voltage. In all, the six voltages provided can be represented by a set of simultaneous equations with six independent variables that are more than sufficient to solve for the two unknowns, namely, impedance magnitude mismatch and impedance phase mismatch. These voltages are inputted to the controller where impedance magnitude and impedance phase angle mismatch are determined and compared to the known or fixed impedance of the power supply to in turn generate command signals for the ratio and tuning servo amplifiers.

Figure 18:
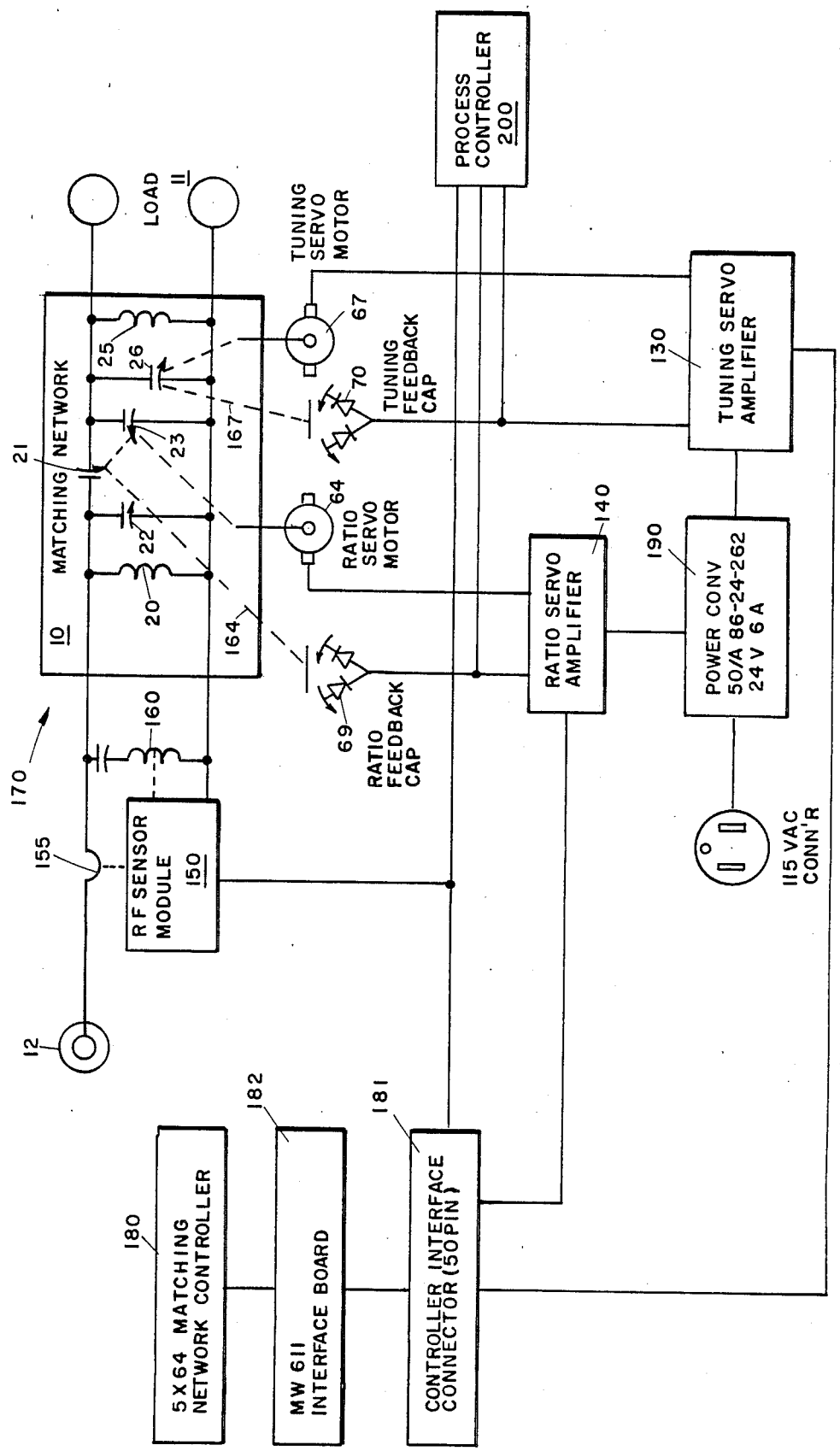
FIG. 18 is a functional diagram of the matching and control circuit of the present invention.

With reference now to FIG. 18, an overall functional diagram of the matching and control circuit of the present invention is generally illustrated at 170. The matching network itself is illustrated at 10 with dotted lines 164 and 167 schematically illustrating the mechanical connection between ratio servo motor 64 and tuning servo motor 67, respectively. The load 11 is illustrated on the output side of matching network 10 while the RF sensor module 150 as well as current sensing transformer 155 and voltage sensing transformer 160 are illustrated on the input terminals of matching network 10. The radio frequency generator is schematically illustrated at 12. The output of RF sensor module 150 is inputted to a matching network controller 180 through controller interface connector 181 and interface board 182. The network controller 180 preferably comprises a suitable digital microprocessor, although an analog controller may be used. The network controller 180 thus receives a signal from RF sensor module 150 which is representative of the impedance of load 11 as seen through matching network 10. This signal is then compared to the known impedance of the power supply 12 and command signals are delivered to ratio servo amplifier 140 and tuning servo amplifier 130. In this case, the impedance of the power supply is known because it is fixed. In applications where a variable impedance power supply is provided, a separate measure of the impedance of the power supply will also be inputted to the network controller 180. The ratio servo amplifier and the tuning servo amplifier also receive ratio feedback signals and tuning feedback signals, respectively, which are compared to the commands issued by network controller 180. Thereafter, the servo amplifiers independently drive the ratio servo motor and the tuning servo motor to directly converge upon an impedance match. A suitable power supply for the servo amplifiers is supplied at 190.

According to another aspect of the present invention, it has been noted that the prior art has failed to use information implicit in the complex load impedance to determine the physical parameters of the discharge process being carried out. Such a determination requires an input condition determining means such as RF sensor module 150; a means for determining the present values of the ratio and tuning elements such as ratio feedback capacitor 69 and tuning feedback capacitor 70; and a means for calculating the desired physical parameters of the discharge process such as a process controller 200. The information implicit in the signals received from RF sensor module 150 include conditions such as delivered power, reflected power, impedance magnitude and phase, harmonic content, steady state voltage, or the like. The means for determining the present values of the ratio and tuning elements may comprise any sensing device that is capable of indicating the electrical state of the ratio and tuning circuits. This may, for example, comprise a mechanical pickoff, a shaft encoder of some type, a potentiometer, a synchro, differential transformer, or the like. Where a mechanical variable ratio or tuning element is driven by a stepper motor, a counter keeping track of steps clockwise or counterclockwise could provide position information. However, in the present case, such information is present in the form of the output of ratio feedback capacitor 69 and tuning feedback capacitor 70 which are inputted to process controller 200.

The process controller is preferably a suitable digital microprocessor, although an analog processor may also be used. With the information available, such a process controller can determine the actual complex load impedance of the discharge process. Further, the process controller can relate the input conditions and complex load impedance to such physical parameters as ion mobility, temperature, pressure, composition, deposition rate and electrode condition. Of course, other parameters can also be inferred. These conditions can be used for active process control or simply displayed and/or recorded for reference.

The above description should be considered exemplary and that of the preferred embodiment only. Modifications of the invention will occur to those who make and use the invention. It is desired to encompass within the present invention all such modifications that come within the proper scope of the appended claims.

The embodiments of the invention in which an exclusive property or privilege is claimed are defined as follows:

1. A matching circuit for delivering radio frequency electromagnetic energy to a discharge process comprising:
   a variable impedance load;
   a radio frequency power supply for applying radio frequency power to said load; and
   a matching network for coupling and impedance matching said power supply to said load said matching network comprising:
   (i) a ratio control means for directly establishing a voltage ratio between said power supply and said load, said ratio control means comprising:
     a first ratio inductance electrically connected parallel to said load;
     a first variable ratio capacitance electrically connected in series with said load;
     a second variable ratio capacitance electrically connected parallel to said load;
     a third variable ratio capacitance electrically connected parallel to said load; and
   (ii) a tuning control means for directly tuning out a complex portion of the reactance of said load, said tuning control means comprising:
     a variable tuning capacitance electrically connected parallel to said load; and
     a tuning inductance electrically connected parallel to said load.

2. The matching circuit of claim 1 wherein said second ratio inductance and said tuning inductance comprise a single lumped component.

3. The matching circuit of claims 1 or 2 wherein said ratio inductances and said tuning inductance comprise a toroidal-shaped electrically insulating form having a layer of electrically conductive material deposited thereon in a pattern which provides a plurality of coils encircling said toroidal-shaped form.

4. The matching circuit of claim 3 wherein said plurality of coils are formed by spirally wrapping a length of plating tape around said toroidal-shaped form, depositing said conductive material layer over said form, and removing said plating tape from said form.

5. The matching circuit of claim 1 wherein said first, second, and third ratio capacitances each comprise a butterfly-shaped ratio capacitor rotor and a ratio stator, said ratio rotors being ganged on a common ratio drive shaft, and said ratio drive shaft being angularly displaced by a ratio torque motor.

6. The matching circuit of claim 1 wherein said tuning capacitance comprises a butterfly-shaped tuning capacitor rotor and a tuning stator, said tuning rotor being mounted on a tuning drive shaft, and said tuning drive shaft being angularly displaced by a tuning torque motor.

7. The matching circuit of claims 5 or 6 further comprising means for making electrical contact and applying power from said power supply to said ratio stator and said tuning stator, whereby said ratio rotor and said tuning rotor are permitted to electrically float.

8. The matching circuit of claim 5 further comprising a ratio feedback capacitor having a butterfly-shaped ratio feedback rotor and a ratio feedback stator; said ratio feedback rotor being disposed on said ratio drive shaft.

9. The matching circuit of claim 6 further comprising a tuning feedback capacitor having a butterfly-shaped tuning feedback rotor and a tuning feedback stator; said tuning feedback rotor being disposed on said tuning drive shaft.

10. The matching circuit of claims 5 or 6 wherein said ratio stator and said tuning stator each comprise a plurality of conductive stator sheets at least partially encompassed by an insulating material.

11. The matching circuit of claim 10 wherein said ratio rotor and said tuning rotor each comprise a plurality of butterfly-shaped conductive rotor sheets encompassed by an insulating material.

12. The matching circuit of claim 11 further comprising means for mounting said stator sheets and said rotor sheets, in a stack, in an interleaved arrangement.

13. The matching circuit of claim 5 wherein said ratio capacitor rotors of said first, second and third ratio capacitors and said ratio stator are provided with a predetermined angular relationship which results in said second and said third ratio capacitance decreasing in capacitance value as said first ratio capacitance increases in capacitance value upon arcuate displacement of said ratio drive shaft.

14. The matching circuit of claims 8 or 9 wherein both of said ratio feedback capacitor and said tuning feedback capacitor further comprise:
 a first feedback rotor section;
 a second feedback rotor section;
 said first and second feedback rotor sections and said feedback stator sections being provided with a predetermined angular orientation which results in the capacitance of said first rotor section being at a minimum when the capacitance of said second rotor section is at a maximum;
 means for applying an AC excitation to said feedback stator sections; and
 means for rectifying connected to said feedback stator sections to provide a servo signal equal to the sum of the currents flowing through said stator sections and representative of the angular orientation of said ratio drive shaft and said tuning drive shaft.

15. The matching circuit of claim 14 further comprising:
 a network controller for establishing a command signal representative of the desired capacitance of said ratio capacitors and said tuning capacitor; and
 a ratio servo amplifier means for comparing said ratio command signal to said servo signal and driving said ratio drive motor and said tuning drive motor.

16. The matching circuit of claim 1 further comprising:
 a radio frequency impedance sensing means for providing a radio frequency impedance signal representative of the impedance of a plasma load; and
 a network controller for comparing said radio frequency impedance signal to the impedance of said power supply and generating command signals representative of the capacitance values of said ratio capacitors and said tuning capacitors required to match the impedance of said plasma load to said power supply.

17. The matching circuit of claim 16 further comprising:
 a means for determining the present values of said ratio capacitors and said tuning capacitor; and
 a process controller for comparing said radio frequency impedance signal to said means for determining the present values of said ratio capacitors and said tuning capacitor and thus determining the physical characteristics of said discharge process.

* * * * *